United States Patent
Ina et al.

(10) Patent No.: US 6,493,065 B2
(45) Date of Patent: Dec. 10, 2002

(54) ALIGNMENT SYSTEM AND ALIGNMENT METHOD IN EXPOSURE APPARATUS

(75) Inventors: Hideki Ina, Yokohama; Seiji Miyata, Saitama, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/866,631

(22) Filed: May 30, 2001

(65) Prior Publication Data

US 2002/0024644 A1 Feb. 28, 2002

(30) Foreign Application Priority Data

May 30, 2000 (JP) ........................................ 2000-160775

(51) Int. Cl.$^7$ .................. G03B 27/42; G03B 27/54; G01B 11/00; G01N 21/86; G03F 9/00
(52) U.S. Cl. ..................... 355/53; 355/55; 355/67; 355/72; 355/75; 355/77; 356/399; 356/400; 356/401; 356/384; 356/387; 250/548; 250/492.2; 250/492.22; 430/5; 430/22
(58) Field of Search ....................... 355/53, 55, 67, 355/72, 75, 77; 356/399, 400, 401, 384, 387; 250/548, 492.2, 492.22; 430/5, 22

(56) References Cited

U.S. PATENT DOCUMENTS

| | | | |
|---|---|---|---|
| 4,669,883 A | 6/1987 | Ina et al. | 356/401 |
| 4,834,540 A | 5/1989 | Totsuka et al. | 356/401 |
| 4,861,162 A | 8/1989 | Ina | 356/401 |
| 4,886,974 A | 12/1989 | Ina | 250/561 |
| 5,659,384 A | 8/1997 | Ina | 355/53 |
| 5,835,227 A * | 11/1998 | Grodnensky et al. | |
| 6,064,486 A * | 5/2000 | Chen et al. | |
| 6,151,120 A | 11/2000 | Matsumoto et al. | 356/399 |
| 6,323,952 B1 * | 11/2001 | Yomoto et al. | |

FOREIGN PATENT DOCUMENTS

| | | | |
|---|---|---|---|
| EP | 0 822 473 | 2/1998 | G05B/19/418 |
| JP | 9-280816 | 10/1997 | G01B/11/00 |
| JP | 10-97966 | 4/1998 | H01L/21/02 |

* cited by examiner

*Primary Examiner*—Russell Adams
*Assistant Examiner*—Khaled Brown
(74) *Attorney, Agent, or Firm*—Fitzpatrick, Cella, Harper & Scinto

(57) ABSTRACT

An exposure system having an exposure apparatus for transferring a pattern of a first object onto a second object, which includes an exposure apparatus having a detecting system for performing relative alignment of the first object and the second object, a transmitting system for transmitting, to a remote location and through a public data line, a mark detection signal obtained by detection of a mark of the second object made by use of the detecting system and shape information obtained by measurement of a shape of the mark on the second object, and a calculating system for performing calculation of an offset of the exposure apparatus, at the remote location. The calculating system transmits information, including the offset, to the exposure apparatus and through the public data line, and, on the basis of the information including the offset, alignment of the first and second objects is executed by using the detecting system and an exposure process is performed in the exposure apparatus.

31 Claims, 13 Drawing Sheets

ALIGNMENT SYSTEM AND ALIGNMENT METHOD IN EXPOSURE APPARATUS

FIELD OF THE INVENTION AND RELATED ART

This invention relates generally to an alignment system and an alignment method. More particularly, the invention concerns an alignment system and an alignment method for use in a semiconductor manufacturing exposure apparatus, for performing a relative positioning (alignment) of a fine electronic circuit pattern (such as an IC, an LSI or a VLSI) formed on the surface of a reticle (first object) and a wafer (second object).

Currently used exposure apparatuses are mainly those called a stepper and those called a scanner. In this specification, however, for convenience, all of them are simply referred to as "exposure apparatus", except in cases where they should be distinguished.

In another aspect, the invention is directed to a method for optimum use of an exposure apparatus, which is based on data communication between a place where the exposure apparatus is present (such as a semiconductor factory) and a place remote therefrom (e.g., a vendor such as a manufacturing apparatus maker or a consultation company), through an internet.

In order to meet further decreases in size and further increases in density of an integrated circuit, projection exposure apparatuses for manufacture of semiconductor devices are required to have an ability of projecting a circuit pattern of a reticle and printing it upon the surface of a wafer, with a high resolving power. Since the projection resolution of a circuit pattern depends on the numerical aperture (NA) of a projection optical system and the exposure wavelength (the wavelength used for the exposure), various exposure methods have been attempted such as, for example, an exposure method in which the NA of a projection optical system is enlarged while the exposure wavelength is fixed, and an exposure method in which the exposure wavelength is shortened such as, for example, from g-line to i-line, from i-line to an excimer laser emission wavelength, or, even in the excimer laser emission wavelength, to 248 nm, 193 nm and to 157 nm. As regards the exposure wavelength of 193 nm, commercial products are already available- On the other hand, due to decreases in size of circuit patterns, there is a requirement for high precision alignment of a reticle (having an electronic circuit pattern) and a wafer. Alignment errors may be generally categorized into an apparatus factor and a process factor. Recently, errors attributable to any apparatus factor are well corrected, as much as possible. As regards errors attributable to any process factor, called WIS (Wafer Induced Shift), an alignment detecting system which can meet this has been proposed by the same assignee of the subject application, as an offset analyzer system.

First, as an example of WIS, due to a process error factor, the shape of an alignment mark or the shape of a resist on that mark becomes asymmetric. During a flattening process in a recently introduced metal CMP (Chemical Mechanical Polishing) process, for example, the structure of an alignment mark frequently becomes asymmetric. This causes, in a global alignment process, a rotational error (FIG. 1A) or a magnification error (FIG. 1B) which directly leads to a deteriorated precision. Here, FIG. 1A illustrates a case where rotational errors are produced in a global alignment process. FIG. 1B shows a case where magnification errors are produced in a global alignment process. Straight lines in these drawings depict the direction and amount of the errors produced.

In an offset analyzer such as mentioned above, for relative alignment of a wafer and a reticle, the position of the wafer is detected by use of an alignment system of a non-exposure light TTL off-axis system having a stable baseline. Prior to this detection, as regards plural but the same marks formed on the wafer for use in the alignment process, the surface shape thereof before and after resist application is measured (at calibration, for example), outside the alignment system (exposure apparatus) and by use of a profiler (solid shape measuring device) such as an AFM (Atomic Force Microscope), for example. Then, an offset, when the three-dimensional relative positional relationship between the resist and the wafer mark is harmonized with a signal of a detecting system of the alignment system, is calculated. The alignment operation is made by using the calculated value. Through the procedure described above, degradation of precision due to the produced symmetry in the alignment mark shape can be avoided.

This is the system called an offset analyzer, in which, outside the alignment system (exposure apparatus), the surface shape is measured before and after resist application, by using a profiler such as an AFM, and in which an offset, as the three-dimensional relative positional relationship between the resist and the wafer mark is harmonized with the signal of a detecting system of the alignment system, is calculated.

FIG. 1C shows the results of measurement of actual alignment marks, made by use of an AFM. Signals are those after resist application. The structure of the alignment marks is such as called a metal CMP, as shown in FIG. 1D. FIG. 1D illustrates the structure of an alignment mark, called a metal CMP. It is seen from FIG. 1C that, as regards the shape of a resist upon alignment marks at left and right side shots as well as an alignment mark at a central shot, the surface shape at the central shot is symmetric whereas the surface shape at the left and right side shots is asymmetric. Also, it is seen that the asymmetry is inverted, between the left and right side shots. This is what called WIS. The WIS can be met by use of an offset analyzer, and high precision and a stable alignment method with a small baseline change can be accomplished.

Referring to FIGS. 1E and 1F, an already proposed offset analyzer will be explained. FIG. 1E is a schematic view for explaining the flow of a wafer and information where an offset analyzer is provided. FIG. 1F shows the structure of the offset analyzer.

Here, as described hereinbefore, a stepper, a scanner, an aligner or the like is called an exposure apparatus. An alignment detecting system is called an alignment scope. A system in which the surface shape is measured before and after resist application, outside an alignment system (exposure apparatus) and by use of a profiler and in which an offset as the three-dimensional relative positional relationship between the resist and the wafer is harmonized with the signal of a detection system of the alignment system, is called an offset analyzer.

Referring to FIG. 1E, the flow of a wafer and information will be described first.

In this example, as shown at step 2 in FIG. 1E, a wafer 31 is conveyed to an offset analyzer 32 before a resist is applied thereto. The shape (surface shape) of an alignment mark on the wafer 31 is measured by using a profiler.

Then, at step 3 in FIG. 1E, the wafer 31 is conveyed to a coater 33 for resist application, and a resist is applied to the wafer.

Then, at step 4 in FIG. 1E, the wafer 31 is conveyed again to the offset analyzer 32, and the surface shape of the resist on the alignment mark is measured by using the profiler.

Subsequently, a signal for the alignment mark on the wafer 31 is detected by use of a detecting system installed in the offset analyzer 32 and being similar to an alignment scope of the exposure apparatus.

Then, by use of a signal simulator of the offset analyzer 32, an offset is calculated. For this offset calculation, a three-dimensional relative positional relationship between the resist and the wafer mark should be harmonized. Specifically, while changing the three-dimensional relative positional relationship between the resist and the wafer mark, the relationship with which the result of the signal simulator is registered with the alignment mark signal, is taken as the three-dimensional relative positional relationship between the resist and the wafer mark. By using the relative positional relationship at that time, an alignment signal is obtained and, from it, an offset for alignment measurement is calculated. The resultant value is supplied to an exposure apparatus (stepper) 35.

On the basis of this offset, the exposure apparatus (stepper) 35 performs an alignment and exposure process (step 5). After exposures of all shots are completed, the wafer 31 is conveyed to a developer 36, and a developing process is performed there (step 6 in FIG. 1E).

Next, referring to FIG. 1F, the structure of the offset analyzer 32 (FIG. 1E) will be explained.

The offset analyzer 32 comprises a chuck 41 for supporting a wafer 31, an X-Y-Z stage for moving the water three-dimensionally, a profiler 43 for performing surface measurement with or without a resist, a detecting system 44 equivalent to an alignment scope provided in the exposure apparatus 35 (FIG. 1E), and a CPU 45 for controlling the offset analyzer 32 as a whole and having a simulator 46 for calculating an alignment offset (an offset amount in the alignment measurement) from the surface shape. A wafer conveying system and a focusing system for the wafer 31 are not illustrated.

Here, an apparatus error (TIS: Tool Induced Shift) of the alignment scope of the exposure apparatus 35 and the offset analyzer 32 should be controlled, or it should be detected. For example, coma aberration of the optical system or non-uniformness of the illumination system corresponds to it.

The alignment scope of the exposure apparatus 35 may be adjusted so that the error can be disregarded. Alternatively, the alignment scope of the exposure apparatus 35 and the alignment detecting system of the offset analyzer 32 may be adjusted to have the same error.

As a method of estimating such TIS, an example has been proposed in Japanese Laid-Open Patent Application, Laid-Open No. 280816/1997.

When the apparatus error information about the alignment scope of the exposure apparatus 35 is predetected, the offset analyzer 32 may not have an alignment detecting system equivalent to the alignment scope of the exposure apparatus 35. For example, the offset analyzer 32 may not have an alignment detecting system equivalent to the alignment scope of the exposure apparatus 35. For example, the offset analyzer 32 may be equipped with a bright field detecting system, while the exposure apparatus may be provided with a dark field detecting system. The offset amount may be calculated while taking into account this error, by using the simulator 46.

The offset analyzer 32 is provided separately from the exposure apparatus 35, which is an exposure machine. With respect to the throughput, it is effective to provide plural offset analyzers in association with plural exposure apparatuses 35 (the number may be different) such that the alignment offset can be calculated in a sequence which does not interfere with the exposure operation in the exposure apparatus.

As described, by measuring an alignment mark and by calculating an offset, to be produced thereby, beforehand, deterioration of precision due to a produced symmetry in the alignment mark shape can be prevented. Thus, a high precision and high throughput alignment method are accomplished.

The offset analyzer described above may be used for all wafers. Alternatively, it may be used in a sequence for a first wafer in restricted conditions. The obtained offset may be used for wafers following the first wafer.

Use of the offset for the wafers following the first wafer is limited to a case where, under restricted conditions (e.g., wafers in a certain lot), the asymmetry in the shape of alignment marks of the wafers has a small dispersion.

As described above, a sequence in which an offset analyzer is used at least once is possible.

As explained above, in a sense of meeting WIS, an offset analyzer can be very effective. However, in the exposure system as a whole, it needs addition of an offset analyzer.

Particularly, in the offset analyzer, an alignment signal is obtained by signal simulation using a simulator, and a measurement error is then calculated from the obtained signal. Each offset analyzer needs a simulator and a computer for driving it. For high speed operation, expensive computers capable of performing high speed calculation must be provided in each exposure system.

SUMMARY OF THE INVENTION

It is an object of the present invention to provide at least one of an adjusting system for an exposure apparatus, an alignment system, an alignment method, a data processing system and a device manufacturing method using one of them, by which an unwanted increase of the apparatus cost can be prevented while retaining the function of an offset analyzer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

[First Embodiment]

Figure 2A:
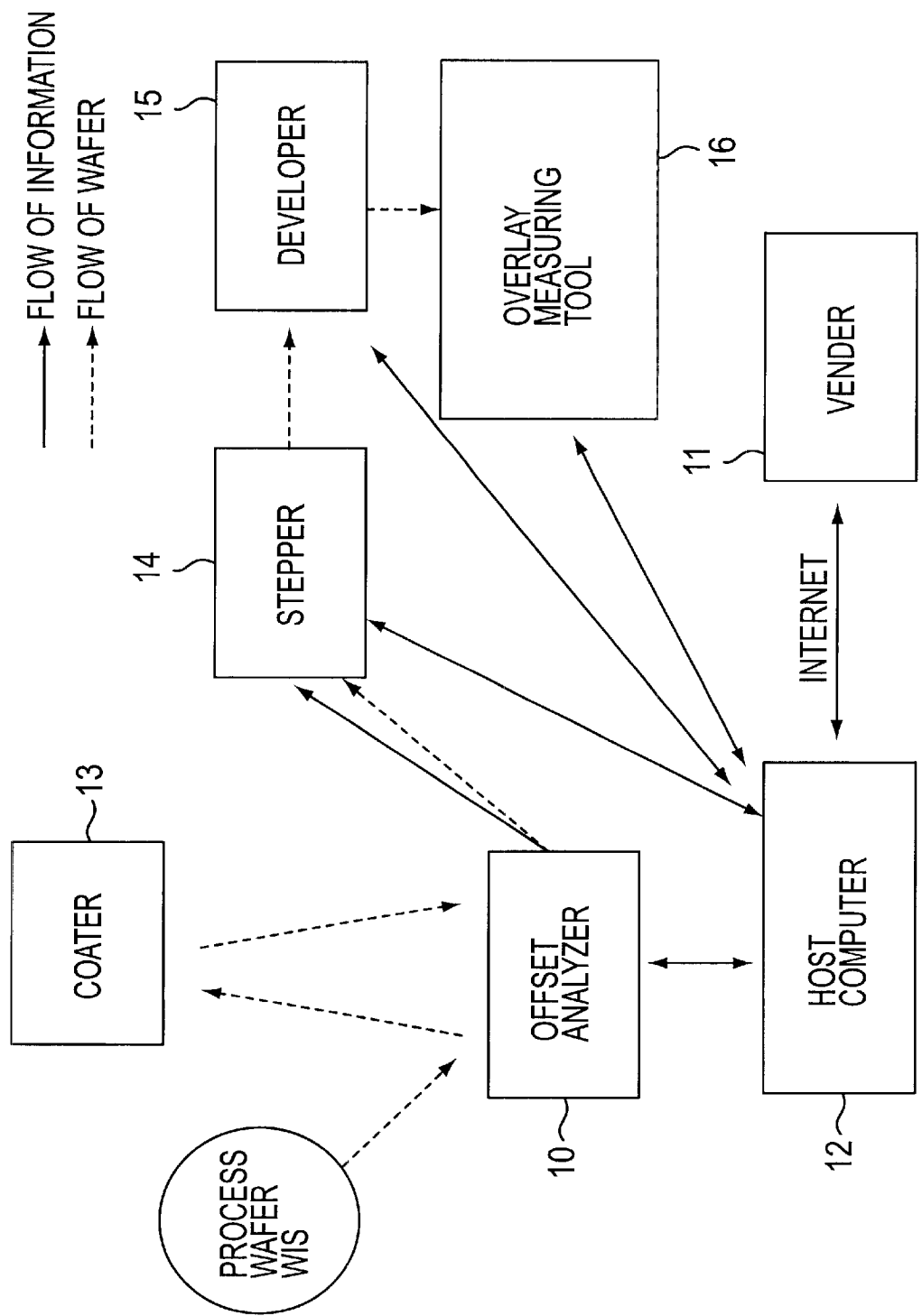
FIG. 2A is a schematic view for explaining the flow of a wafer and information in an offset analyzer, using an internet, according to an embodiment of the present invention.

FIG. 2A is a schematic view for explaining the flow of a wafer and information in an offset analyzer according to a first embodiment of the present invention. Denoted in the drawing at 10 is an offset analyzer, and denoted at 11 is a vendor. Denoted at 12 in a host computer, and denoted at 13 is a coater. Denoted at 14 is an exposure apparatus (stepper), and denoted at 15 is a developer. Denoted at 16 is an overlay measurement tool.

Figure 1A:
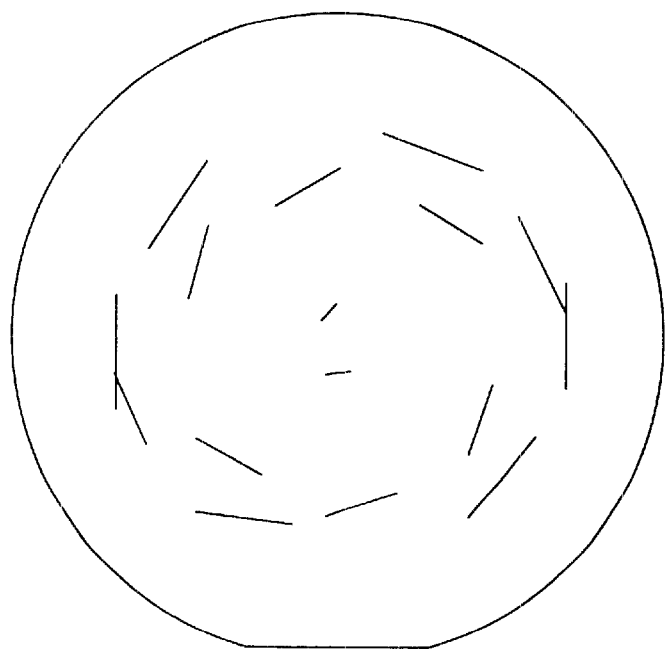
FIG. 1A is a schematic view for explaining rotational errors to be produced in a global alignment.
Figure 1B:
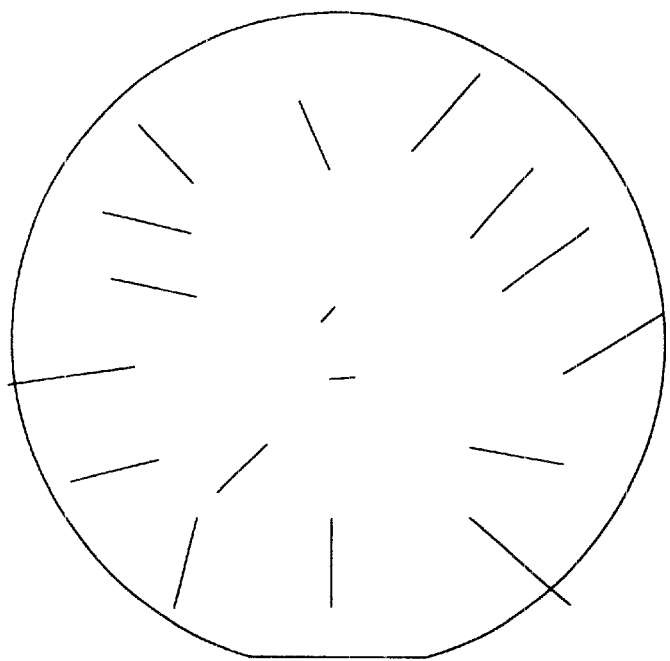
FIG. 1B is a schematic view for explaining magnification errors to be produced in a global alignment.
Figure 1C:
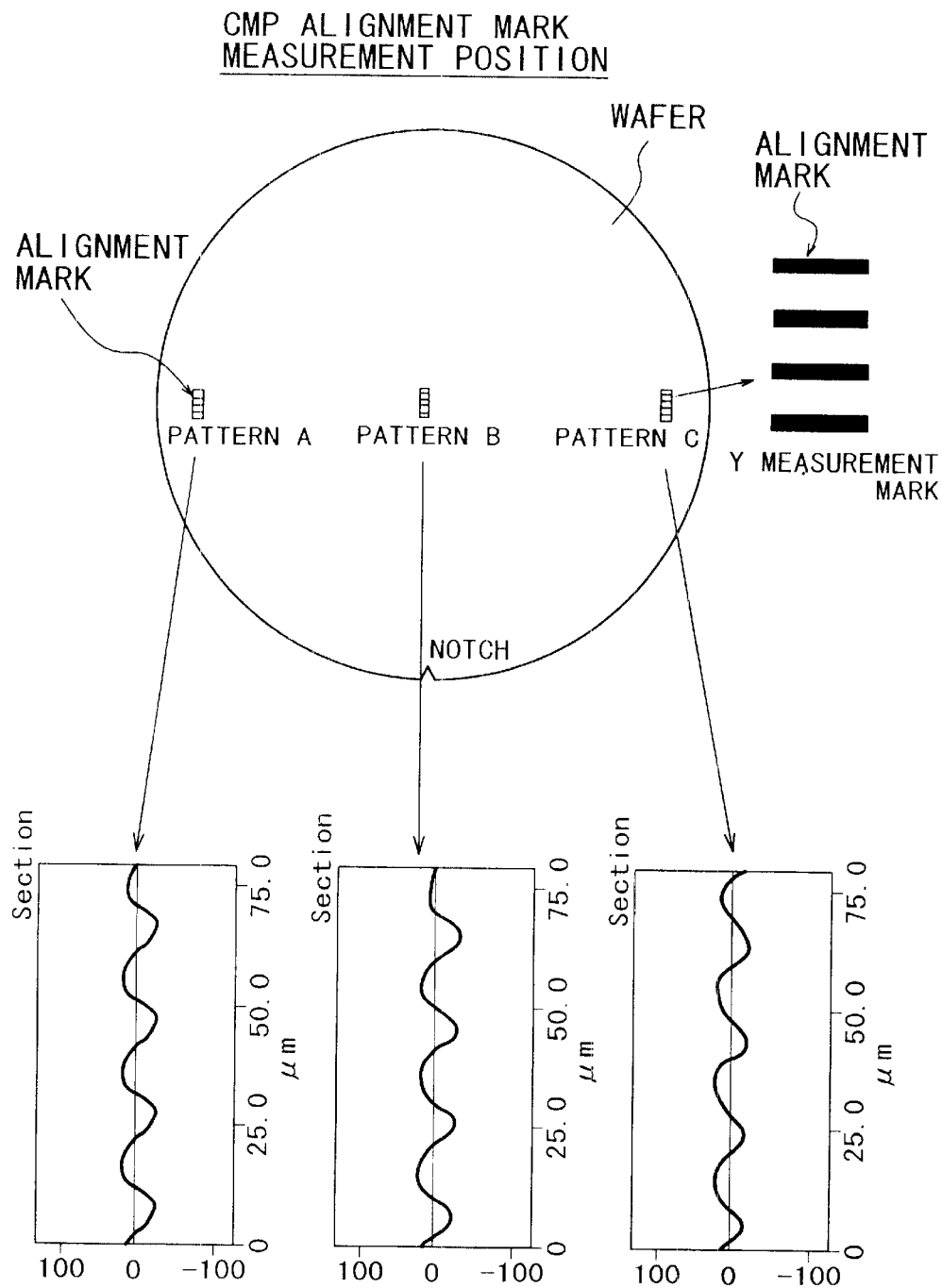
FIG. 1C is a schematic view for explaining results of measurement of actual alignment marks, made by use of an AFM.
Figure 1D:
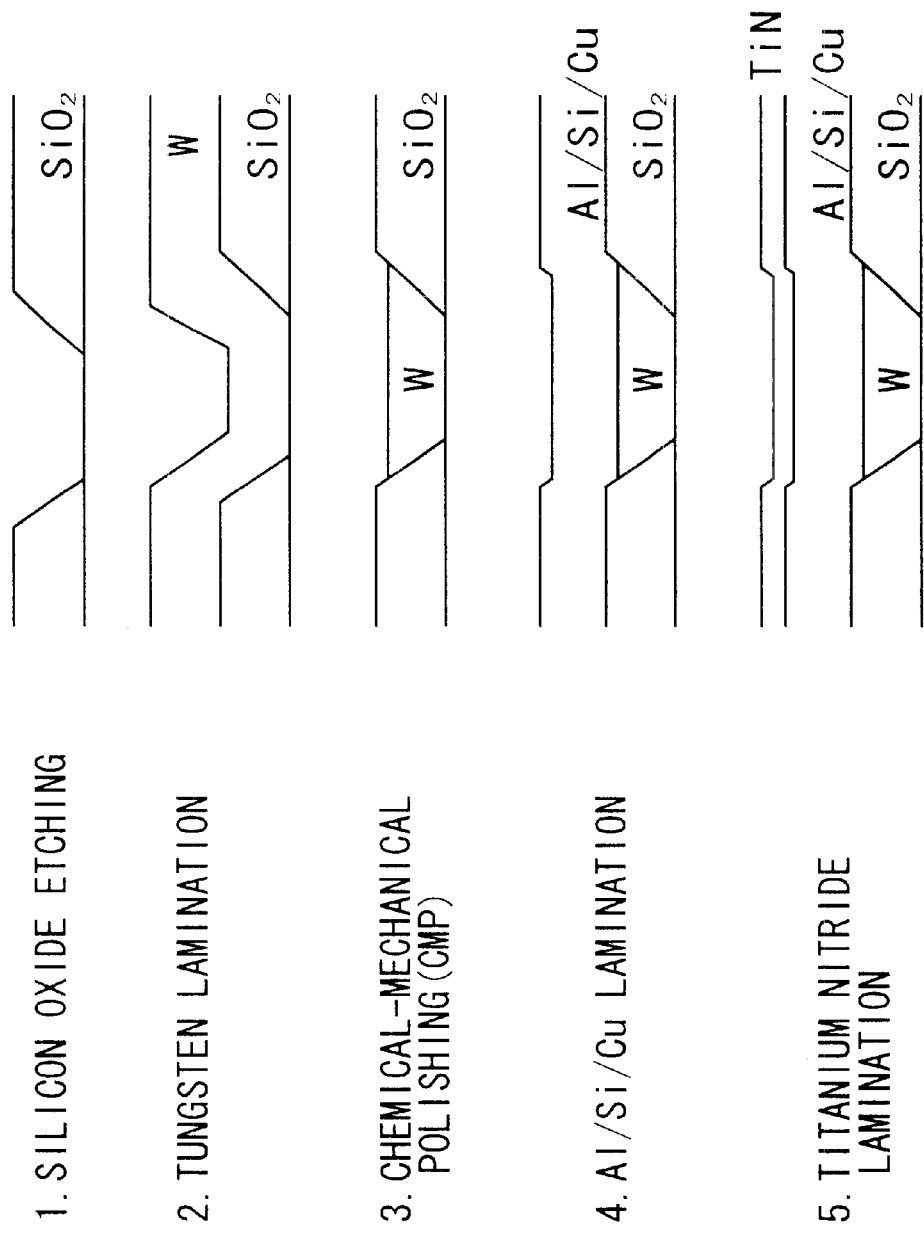
FIG. 1D is a schematic view for explaining the structure of an alignment mark, called a metal CMP.
Figure 1E:
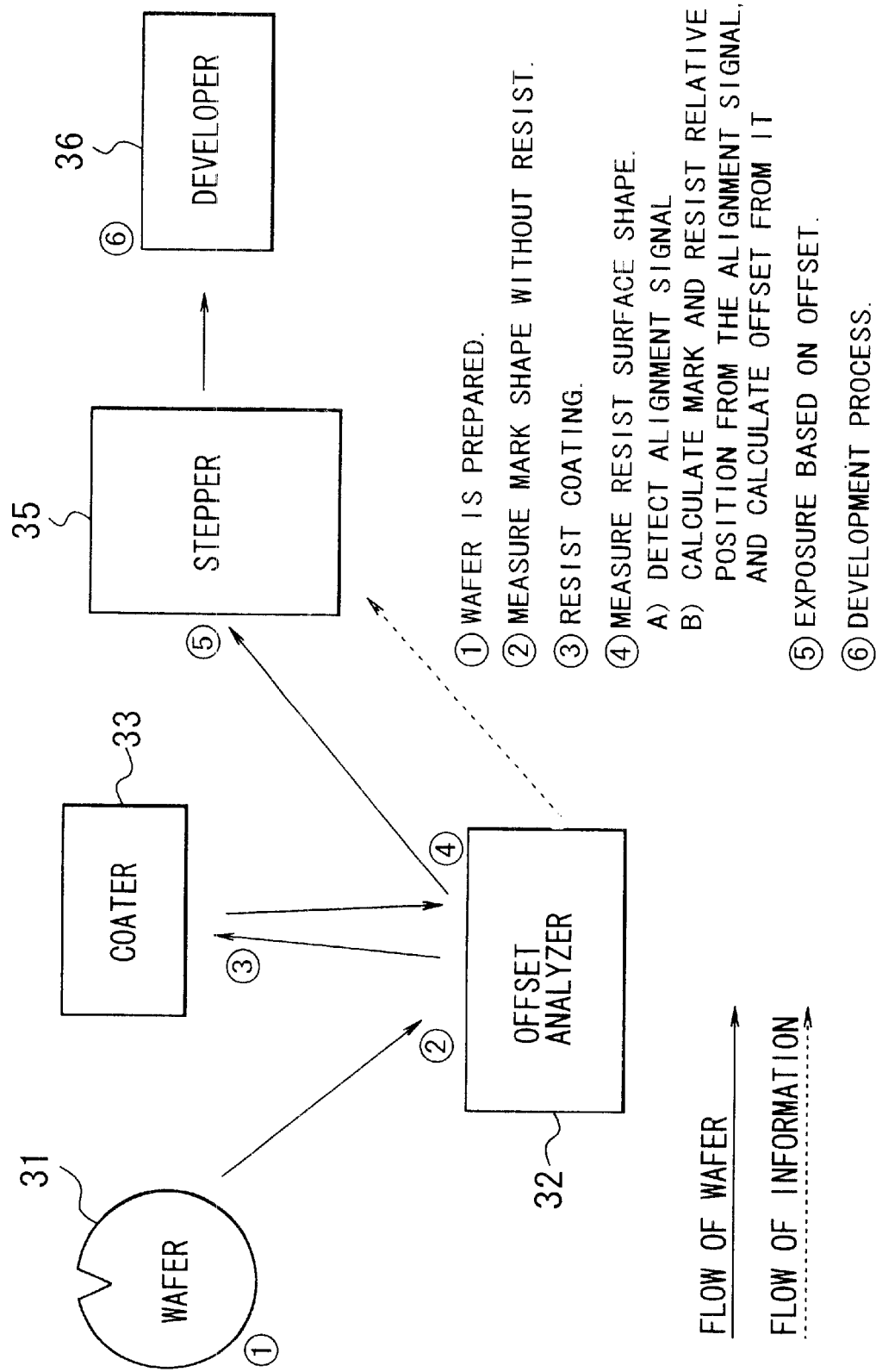
FIG. 1E is a schematic view for explaining the flow of a wafer and information in a case where an offset analyzer is provided.

A major distinction of this embodiment to the offset analyzer described with reference to FIG. 1E is that a signal simulator is at the vendor 11 side, and that three-dimensional shape data and alignment signal data are supplied from the host computer 12 in a semiconductor manufacturing factory to a host computer of the vendor 11 through an internet. The offset amount to be produced is calculated there by the signal simulator. The calculation method may be the same as described above. Then, again through this internet, the thus calculated offset amount is fed to the host computer 12 at the semiconductor manufacturing factory and, from there, it is supplied to the exposure apparatus 14, such that the exposure process is performed.

Figure 2B:
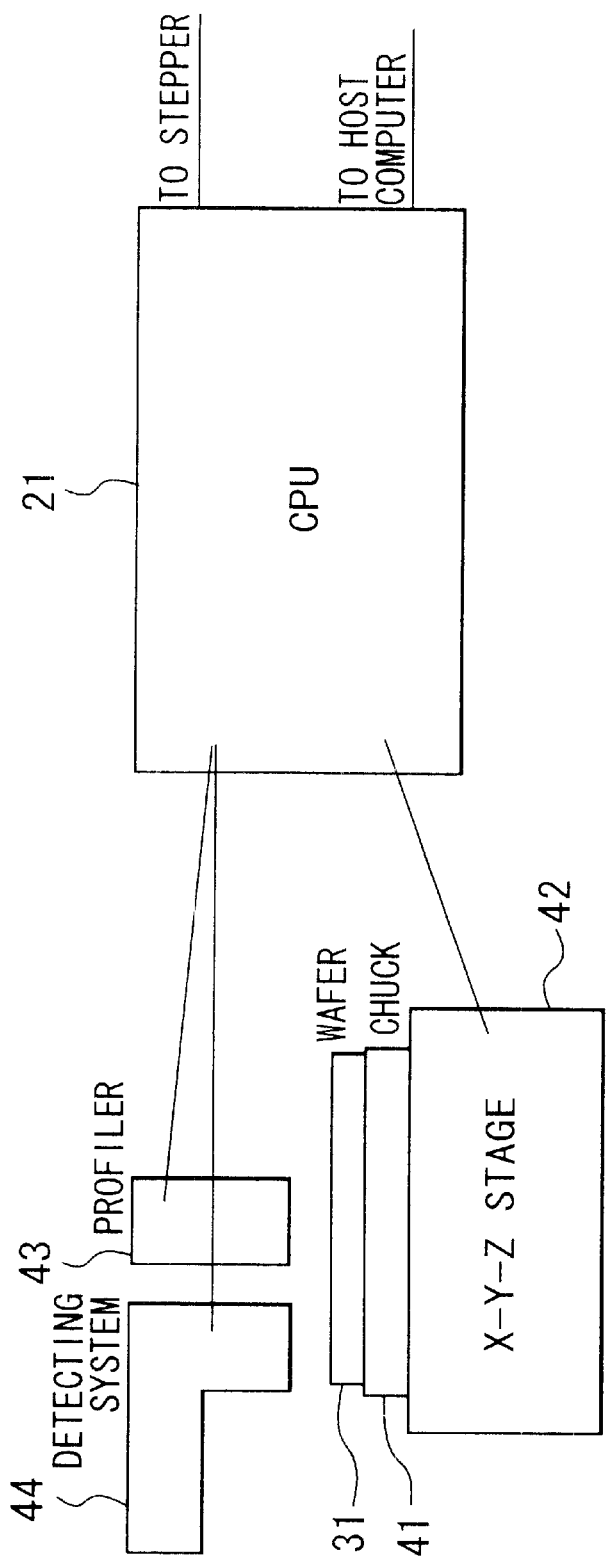
FIG. 2B is a schematic view for explaining the structure of an offset analyzer to be used with an internet, according to an embodiment of the present invention.

FIG. 2B is a schematic view of the structure of the offset analyzer 10 according to the first embodiment of the present invention, when used with the internet.

Figure 1F:
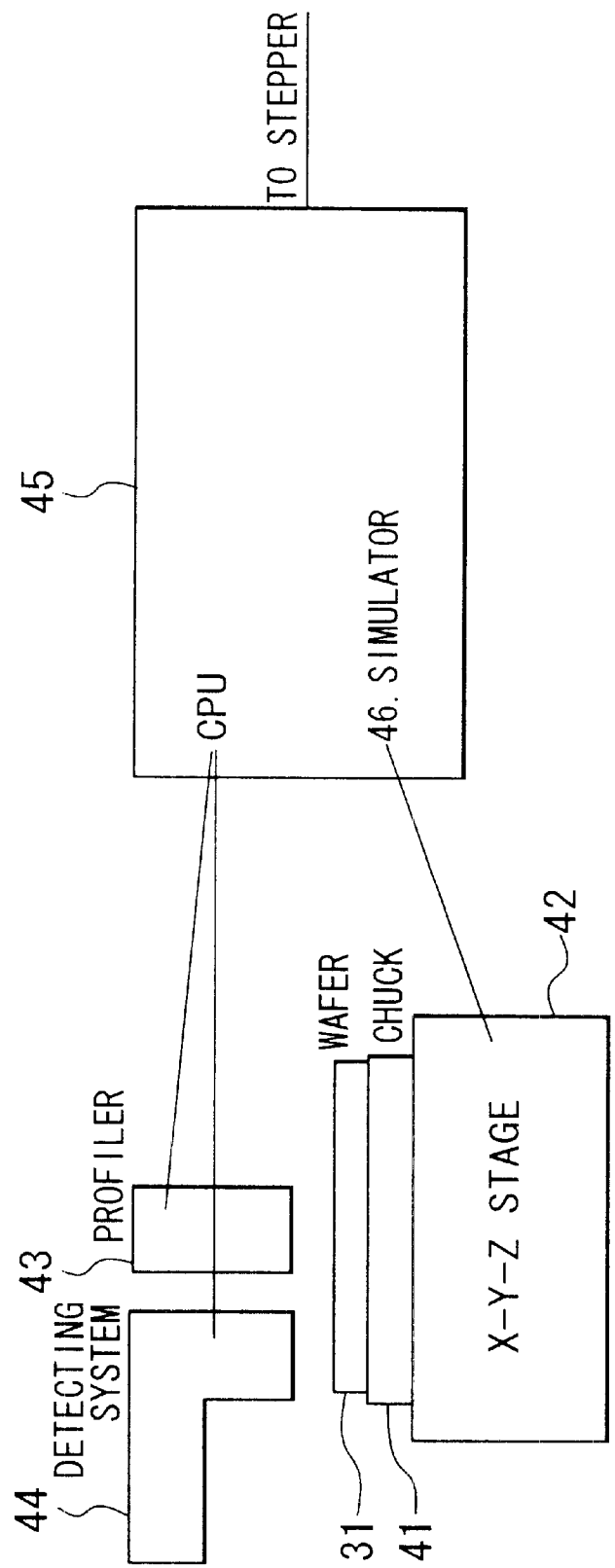
FIG. 1F is a schematic view for explaining the structure of an offset analyzer.

A major distinction of this embodiment to the offset analyzer 32 shown in FIG. 1F is that there is no signal simulation (simulator 46) involved in a CPU 21 of the offset analyzer 10, and that it is communicated with the host computer 12 (FIG. 2A).

A maintenance remote-control system for an industrial machine using an internet has been proposed in Japanese Laid-Open Patent Application, Laid-Open No. 97966/1998, filed by the same assignee of the subject application.

In Japanese Laid-Open Patent Application, Laid-Open No. 97966/1998, like the present invention, information is communicated between a place (such as a semiconductor manufacturing factory, for example) where an exposure apparatus (as an example of an industrial machine) is present and a place remote therefrom (e.g., a vendor such as a manufacturing machine maker or a consultation company), and an internet is used for performing the maintenance of the exposure apparatus.

Japanese Laid-Open Patent Application, Laid-Open No. 97966/1998, concerns a maintenance system which is particularly effective when any disorder occurs due to an apparatus factor. As compared therewith, the present invention concerns a system (e.g., an adjusting system) which can meet any problem attributable to a process factor such as WIS, for example, and therefore which is very effective to users. Also, the present invention concerns a data processing system for performing various data processing to information concerning an exposure apparatus, by using a public data line.

The internet-related portion of this embodiment is similar to that of the system proposed in Japanese Laid-Open Patent Application, Laid-Open No. 97966/1998. In the offset analyzer 10 of the present invention shown in FIG. 2A, the coater 13, the exposure apparatus (stepper) 14, the developer 15, the overlay inspection unit (overlay measurement tool) 16 and so on are connected to the host computer 12 through a LAN (e.g., intranet). The host computer 12 and a computer of the vendor 11 can communicate with each other through the internet, and thus, an exposure system is established. The communication protocol usable in this embodiment is a packet communication protocol (TCP/IP) used in the internet.

[Another Embodiment]

The procedure for effectively using an exposure apparatus to meet WIS on the basis of data communication between a place (e.g., a semiconductor manufacturing factory) where an exposure apparatus is present and another place (e.g., a vendor such as a manufacturing apparatus maker or a consultation company) remote from it, as described above, develops a new function.

More specifically, as a result of this procedure, data such as wafer signals, shape measurement values, and overlay measurement results is fed to a vendor (e.g., a manufacturing apparatus maker or a consultation company) from plural semiconductor manufacturing factories through the internet. Consequently, a database concerning various information, including apparatus errors, can be constructed at the vendor side.

Using this database, categorization of errors attributable to apparatus factors and process factors, with respect to a required precision, can be done on the basis of actual data obtained at plural semiconductor manufacturing factories. In other words, an alignment error budget can be rebuilt. The WIS is taken into account, in this budget.

Conventionally, most of obtainable error amounts are those related to process factors. Through the data communication using the internet as in the present invention, a database which is really effectively usable can be constructed. Also, from this, an error budget can be rebuilt while taking into account the WIS.

This makes it possible to discriminate or specify a particular error which, when reduced, contributes to effectively increase the precision. Therefore, it may be a guideline for increasing not only the yield but also the precision.

As described above, the procedure using an offset analyzer prevents the precision deterioration due to the asymmetry in the shape of an alignment mark produced in a process. This eliminates the necessity of a complicated optimization procedure for attaining a high precision and high throughput alignment method (alignment system and/ or alignment method) without being influenced by a semiconductor forming process such as CMP. Further, based on the data communication through the internet, a database which is really effectively usable can be constructed. This enables rebuilding an error budget in which the WIS is taken into account. As a result, it is possible to improve the CoO (Cost of Ownership) over the whole lithography process.

In the foregoing description, the exposure machine for printing a circuit pattern has been referred to as an exposure apparatus. As described above, the present invention is effectively applicable to an alignment system and/or an alignment method in an exposure apparatus called a stepper or a scanner, or alternatively, any other apparatus based on unit-magnification X-ray exposure, electron beam direct patterning exposure, or EUV exposure, for example, is used.

As a matter of course, it is necessary that, from a signal of an alignment detecting system included in an exposure machine of a particular exposure method, alignment mark and resist shape information is obtainable, and calculation can be done by the signal simulation.

[Embodiment of Semiconductor Manufacturing System]

Next, an embodiment of a manufacturing system for semiconductor devices such as semiconductor chips (e.g., IC or LSI), liquid crystal panels, CCDs, thin film magnetic heads, or micro-machines, for example, using an exposure apparatus which is the subject of control by an adjustment system such as described above, will be explained. The system is arranged so that repair of any disorder occurring in a production machine placed in a semiconductor manufacturing factory or periodic maintenance thereof or, alternatively, a maintenance service such as software supply, can be made by use of a computer network outside the manufacturing factory.

Figure 3:
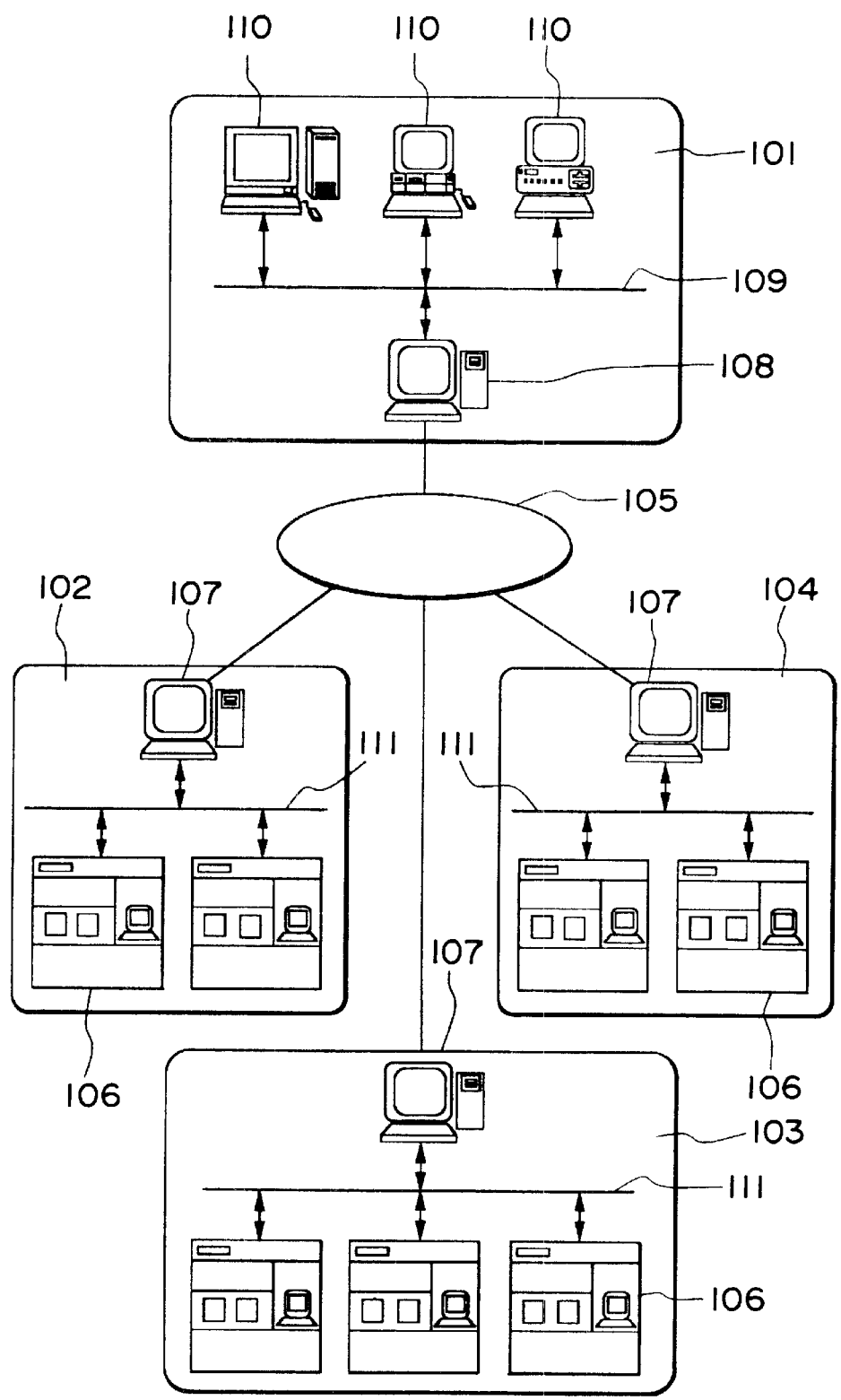
FIG. 3 is a schematic view of a semiconductor device manufacturing system, including an exposure apparatus according to an embodiment of the present invention, in a certain aspect thereof.

FIG. 3 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (various lithographic apparatuses such as an exposure apparatus, for example, as well as a heat treatment apparatus, a film forming apparatus, and a flattening apparatus) and post-process machines (an assembling machine and an inspection machine, for example) are assumed. Inside the business office 101, there are a host control system 108 for providing a maintenance database for the production machines, plural operating terminal computers 110, and a local area network (LAN) 109 for connecting them to constitute an intranet. The host control system 108 is provided with a gateway for connecting the LAN 109 to the internet 105 which is an outside network of the office, and a security function for restricting the access from the outside.

On the other hand, denoted at 102–104 are plural manufacturing factories of a semiconductor manufacturer or manufacturers as a user (users) of production machines. The factories 102–104 may be those which belong to different manufacturers or to the same manufacturer (e.g., they may be a pre-process factory and a post-process factory). In each of the factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105 which is an outside network of the factory. With this structure, the host control system 108 of the vendor 101 can be accessed from the LAN 111 in each factory, through the internet 105. Further, due to the security function of the host control system 108, only admitted users can gain access thereto. More specifically, through the internet 105, status information representing the state of operation of the production machines 106 (for example, the state of the machine in which any disorder has occurred) may be transmitted as a notice from the factory to the vendor. Additionally, any response information which is responsive to the notice (that is, for example, information on how the disorder should be treated or software data concerning the treatment) as well as a latest software program and maintenance information such as help information, may be supplied from the vendor. The data communication between each factory 102–104 and the vendor 101 as well as the data communication through the LAN 111 in each factory, may use a communication protocol (TCP/IP) generally used in the internet. In place of using the internet, an exclusive line network (e.g., an ISDN) controlled with strictest security that access by a third party is not allowed, may be used. Further, the host control system is not limited to the system as provided by the vendor. A database may be structured by the user and it may be set in an outside network, such that it can be accessed from plural user factories.

In the system described above, three-dimensional shape data of a wafer mark to be supplied to a corresponding exposure apparatus 106 or alignment signal data in the corresponding exposure apparatus 106 are transmitted to the vendor side host control system 108 through the internet, for example. The offset calculation is made there by using a signal simulator. The thus obtained offset data is then transmitted back to the host control system 107, again through the internet, for example, and also then to the corresponding exposure apparatus 106, to perform the alignment offset correction.

Figure 4:
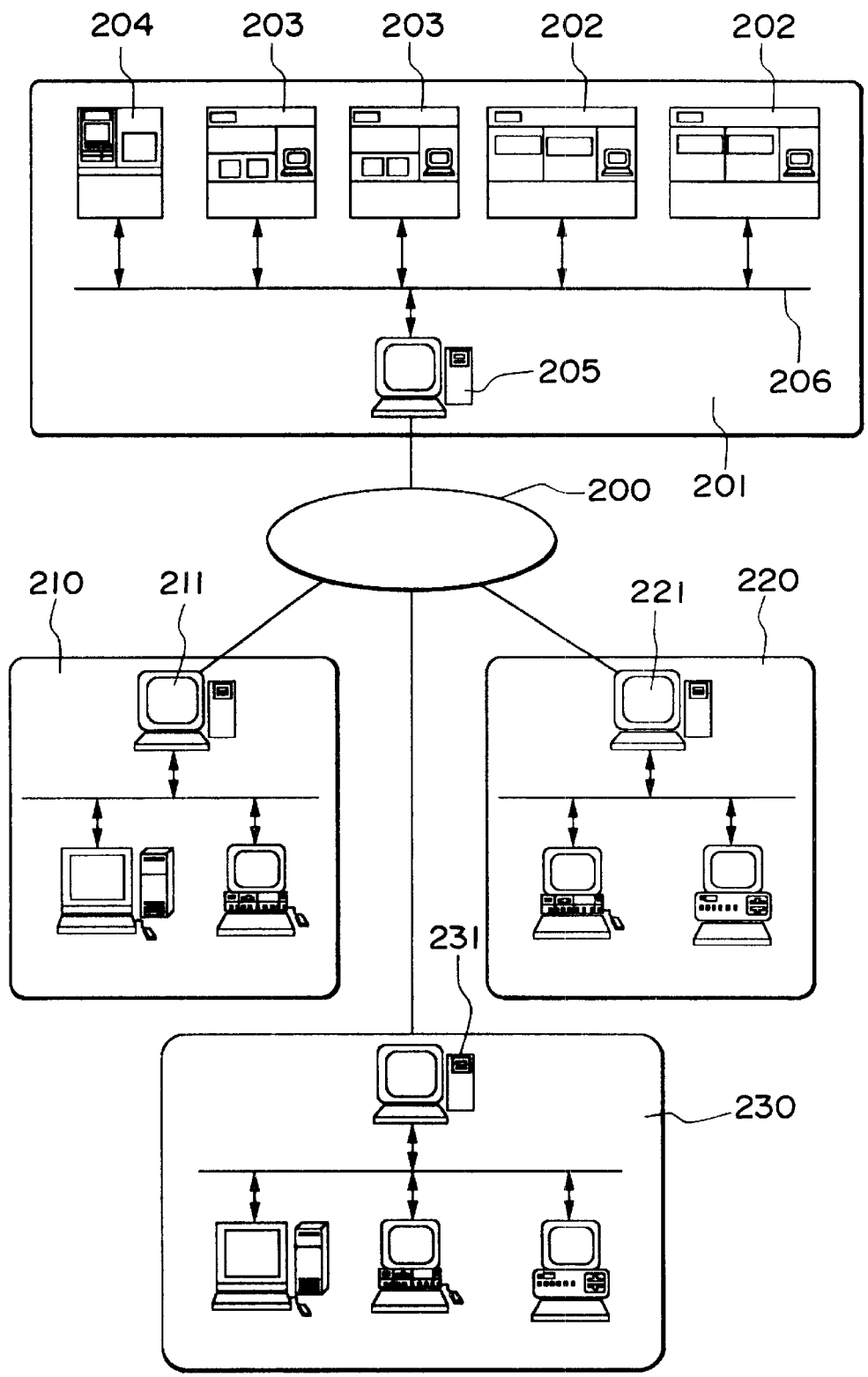
FIG. 4 is a schematic view of a semiconductor device manufacturing system, including an exposure apparatus according to an embodiment of the present invention, in another aspect thereof.

FIG. 4 is a schematic view of a general structure of the production system according to this embodiment, in another aspect thereof different from that of FIG. 3. In the preceding example, plural user factories each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 202, a resist processing apparatus 203, and a film formation processing apparatus 204 are introduced. Although only one factory 201 is illustrated in the drawing, in practice, plural factories may be arranged into the network. Each production machine in the factory 201 is connected through a LAN 206 to constitute an intranet. The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 200. Therefore, the suspension of the production line is short.

Figure 5:
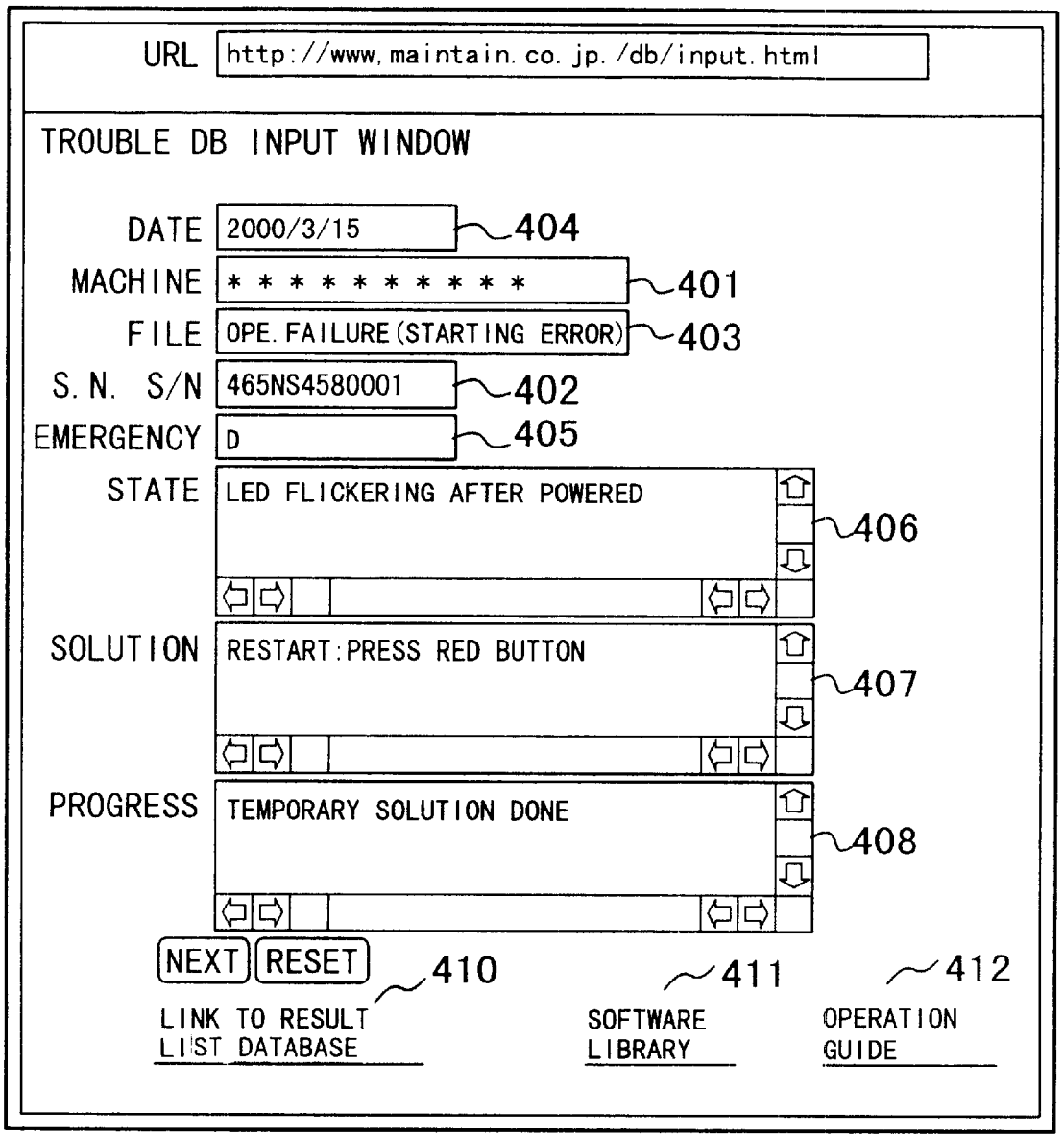
FIG. 5 is a schematic view of an example of a user interface, in a semiconductor device manufacturing system having an exposure apparatus according to an embodiment of the present invention.

Each of the production machines in the factory may have a display, a network interface and a computer for executing network accessing softwares, stored in a storage device, as well as machine operating softwares. The storage device may be an internal memory or a hard disk or, alternatively, it may be a network file server. The network accessing softwares may include an exclusive or wide-use web browser, and a user screen interface such as shown in FIG. 5, for example, may be provided on the display. Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user's display. Further, the user interface as provided by the web browser enables a hyperlink function (410–412) as illustrated. As a result, the operator can access further details of information in each item, or he/she can get a latest version software to be used for the production machine, from the software library as provided by the vendor. Alternatively, the operator can get an operation guide (help information) prepared for factory operators. Here, the maintenance information to be supplied by the maintenance database may include those related to the present invention as described above. Also, the software library may provide the latest software for accomplishing the present invention.

In the system described above, the host control system 205 performs data communication to transmit three-dimensional wafer mark shape data, to be supplied to a corresponding exposure apparatus 202, as well as alignment signal data obtained therein, only to the host control system of a manufacture vendor of that exposure apparatus, under high confidentiality assured by a coding or ciphering program, for example. At the vendor side, offset data is calculated by a simulator, and the result is fed back to the host control system 205 under similarly high confidentiality. The host control system 205 supplies this offset data only to the corresponding exposure apparatus. In response, the exposure apparatus performs the offset correction, using it. The system shown in FIG. 3 or 4 uses the first embodiment. However, any other embodiment may be used.

Next, a structure for supplying control information by a vendor, using the above-described system, will be explained.

A user and a particular vendor are arranged so that various data at the user side are fed to the vendor side, and the vendor provides offset data for the apparatus with a charge, while renewing the data at any time. Namely, the user receives particular software from the vendor, by using which the user can transmit various data to the vendor through the internet under high confidentiality, periodically or each time of information collection, and by using which the user can get offset data from the vendor side through the internet under high confidentiality. This software has been installed into each host control system 205. On the other hand, the vendor side host control system is operable to count the frequency of the data supply from the user, concerning the apparatus. Also, it checks the history of offset data supply with respect to each of the apparatuses, and it prepares billing data.

This will be described in more detail. The three-dimensional shape data about the wafer mark as supplied from the host control system 205 to the exposure apparatus manufactured by the vendor, as well as the obtained alignment signal data are transmitted to the vendor, while being correlated with the corresponding exposure apparatus. Further, at the user side, the data concerning the results of overlay measurement having been performed in the corresponding exposure apparatus is memorized into the host control system, together with the ID of that exposure apparatus, the time of inspection execution, and various exposure conditions (e.g., resist type, illumination condition, magnification, etc.) in the actual exposure process. These data are also supplied to the vendor.

The vendor side collects such data from different users and plural factories, through the vendor host control system and the internet. By using a processing unit (not shown) for database construction, a database is constructed. On the basis of an analysis with respect to the tendency of alignment errors, for example, using this database, the alignment error categorization between those attributable to any apparatus factor and those attributable to any process error, can be attained. Based on this error categorization, and in relation to each exposure apparatus, the vendor prepares offset data corresponding to an actually produced alignment error of a corresponding exposure apparatus. Also, the vendor transmits the offset data to the user side host control system which controls the corresponding exposure apparatus.

Figure 8:
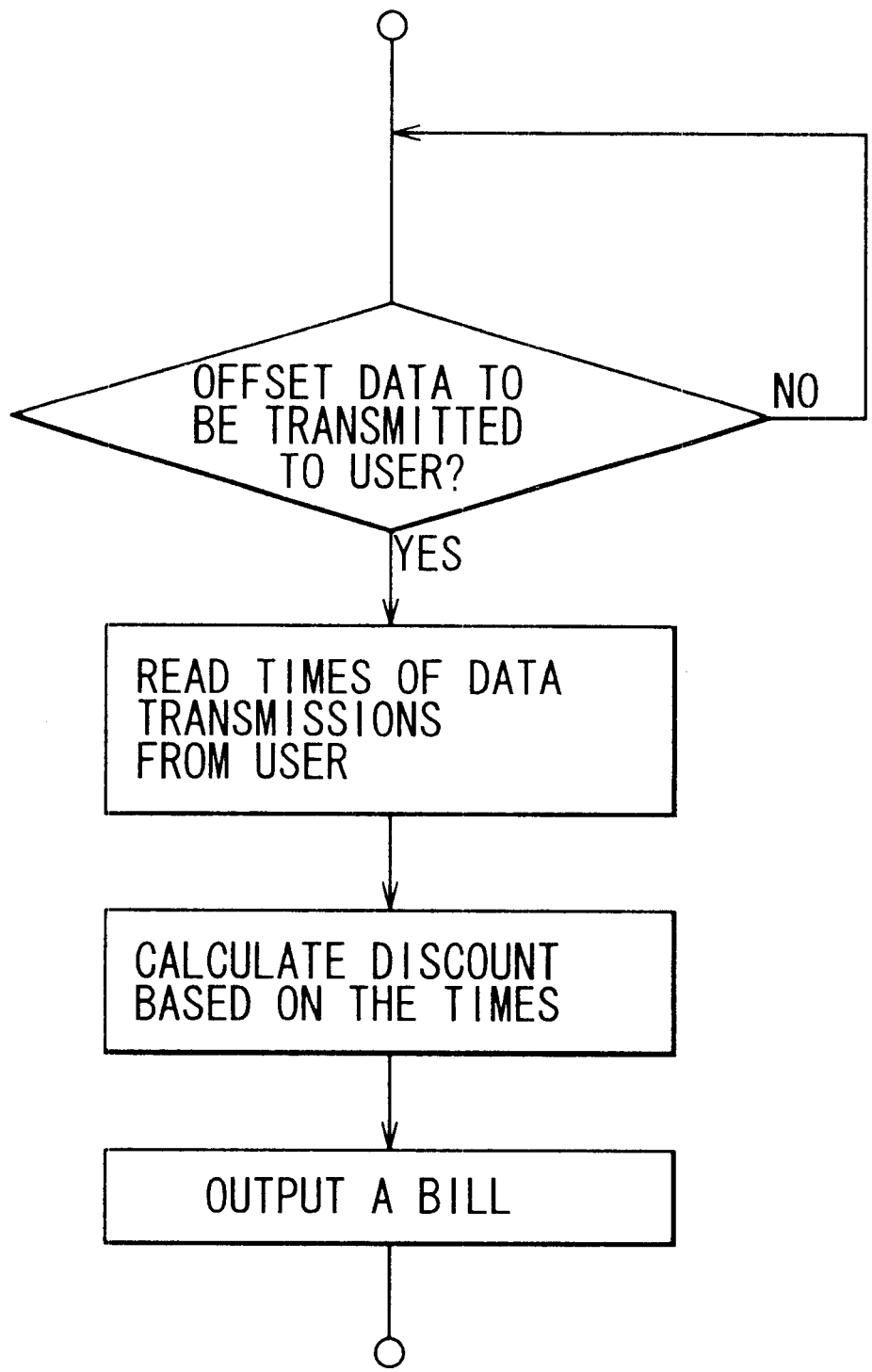
FIG. 8 is a flow chart for explaining a billing system according to an embodiment of the present invention.

Referring to the flow chart of FIG. 8, the billing system in the vendor side host control system will be explained.

When offset data is transmitted in relation to a corresponding exposure apparatus at the user side, the frequency of data reception from the user side having been stored in relation to that exposure apparatus is read out. When the vendor prepared the offset data, the vendor received benefit of data presented by the user in relation to that machine. In consideration of it, when the bill is calculated, a discount corresponding to the frequency of data reception is given to the user. Here, the discount amount corresponding to the data reception frequency is calculated, and the amount of money resulting from subtracting the discount amount from the basic charge is outputted as the charge.

With such a billing system as described above, when a user obtains appropriate offset data corresponding to the machine, the service is provided with payment of a cheaper charge corresponding to the data given to the vendor. This is advantageous also to the vendor, since, with this billing system, the vendor can afford the service to the user with an appropriate charge corresponding to the user's contribution.

Next, a semiconductor device manufacturing process which uses the production system described above, will be explained.

Figure 6:
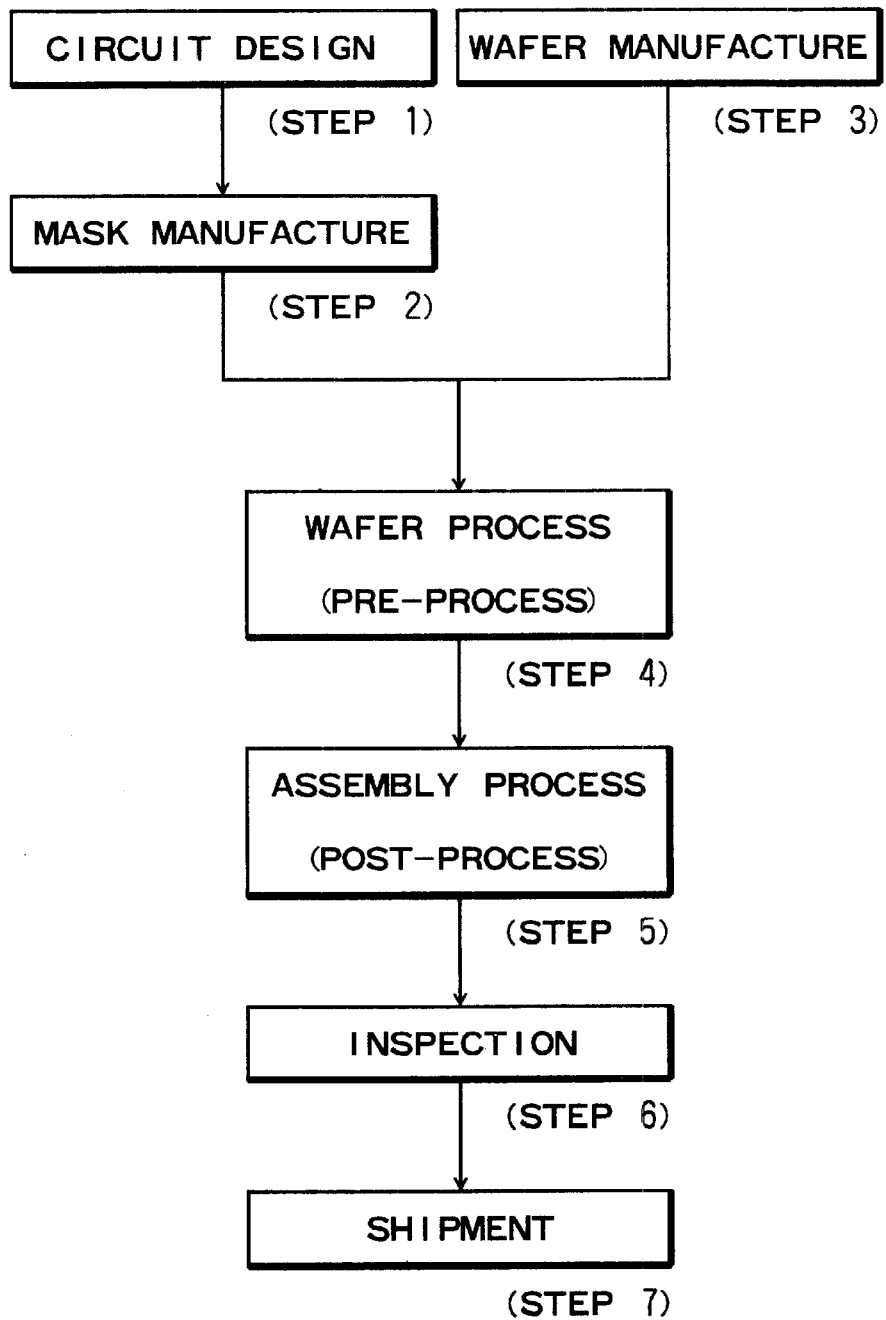
FIG. 6 is a flow chart of device manufacturing processes, using an exposure apparatus according to an embodiment of the present invention.

FIG. 6 is a flow chart of a general procedure for the manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

Figure 7:
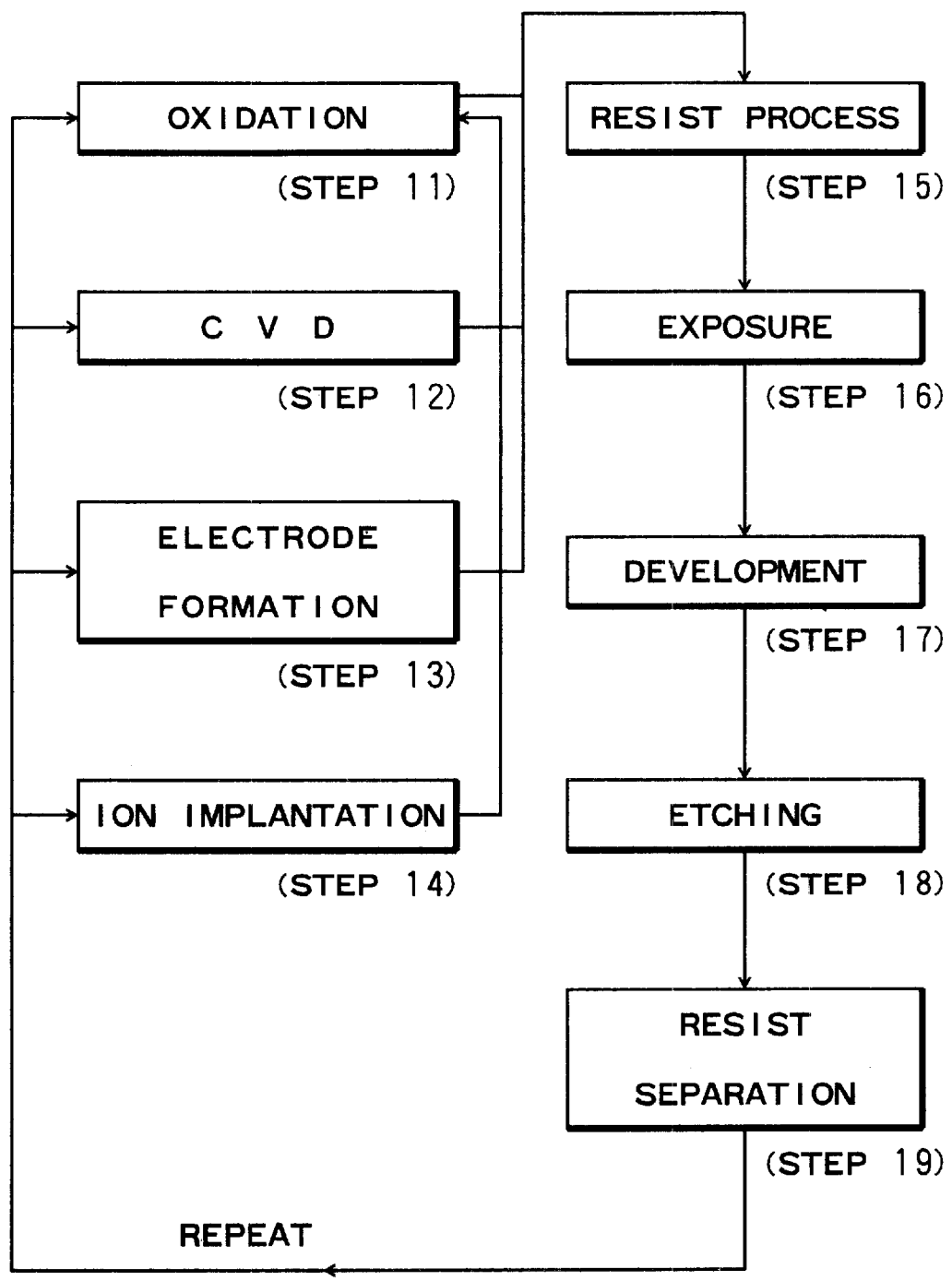
FIG. 7 is a flow chart for explaining details of a wafer process, using an exposure apparatus according to an embodiment of the present invention.

FIG. 7 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

As described hereinbefore, an offset analyzer using the internet is structured and used, by which deterioration of precision due to the asymmetry in shape of an alignment mark caused by a process can be prevented. As a result, a high precision and high throughput alignment method can be accomplished without being influenced by a semiconductor forming process such as CMP, for example, and without an increase of the cost. This eliminates the need for complicated optimization in the process. Further, through the data communication using the internet, a really effective database can be constructed. This enables rebuilding an error budget, taking into account the WIS. Thus, the CoO (Cost of Ownership) over the whole lithography process can be improved.

While the invention has been described with reference to the structures disclosed herein, it is not confined to the details set forth and this application is intended to cover such modifications or changes as may come within the purposes of the improvements or the scope of the following claims.

What is claimed is:

1. A system having an exposure apparatus for transferring a pattern of a first object onto a second object, said system comprising:

an exposure apparatus having a detecting system for performing relative alignment of the first object and the second object;

a transmitting system for transmitting, to a remote location and through a public data line, a mark detection signal obtained by detection of a mark of the second object made by use of said detecting system and shape information obtained by measurement of a shape of the mark on the second object; and a calculating system for performing calculation of an offset of the exposure apparatus, at the remote location, wherein said calculating system transmits information, including the offset, to the exposure apparatus and through the public data line, and wherein, on the basis of the information including the offset, alignment of the first and second objects is executed by using said detecting system and an exposure process is performed in said exposure apparatus.

2. A system according to claim 1, wherein, for calculation of an offset on the basis of simulation, instructions for performing detection of plural marks under different conditions are supplied from the remote location through the public data line, and wherein the mark detection signal obtained by said detecting system at least under different conditions is fed to the remote location through the public data line.

3. A system according to claim 1, wherein, for measurement of the shape of the mark on the second object to be done outside the exposure apparatus, the surface shape is measured before and after application of a resist material.

4. A system according to claim 3, wherein the surface shape is measured by using a solid shape measuring device, at the time of calibration.

5. A system according to claim 4, wherein said solid shape measuring device comprises an atomic force microscope.

6. A system according to claim 1, wherein said solid shape measuring device comprises a probe type solid shape measuring device.

7. A system according to claim 1, wherein, when a surface shape of plural marks on the second object is measured outside the exposure apparatus and before and after resist application, an offset being harmonized with a signal of a detecting system for performing relative alignment of the first and second objects, in the exposure apparatus for transferring the pattern of the first object onto the second object, is used in the exposure apparatus.

8. A system according to claim 7, wherein the surface shape is measured outside the exposure apparatus, on the basis of optical three-dimensional measurement calibrated by a three-dimensional shape measuring system using non-exposure light.

9. A system according to claim 1, wherein said exposure apparatus has an alignment system being arranged so that, for alignment of plural second objects, with respect to a first one of the plural second objects, an offset as being harmonized with a signal of a detecting system for performing relative alignment of the first and second objects is measured, and that, with respect to the remaining second objects, the same offset is used.

10. An adjusting method for use in an exposure apparatus for transferring a pattern of a first object onto a second object, said method comprising:

a first transmitting step for transmitting, to a remote location and through a public data line, a mark detection signal obtained by detecting a mark on the second object by use of a detecting system, for performing relative alignment of the first and second objects in the exposure apparatus, and shape information obtained by measuring a surface shape of the mark on the second object, outside the exposure apparatus and before and after resist application;

a calculating step for calculating an offset of the exposure apparatus, at the remote location; and a second transmitting step for transmitting information, including the offset, to the exposure apparatus through the public data line, wherein alignment of the first and second objects is carried out by the detecting system and on the basis of the information including the offset, and an exposure process is carried out in the exposure apparatus.

11. A method according to claim 10, wherein the surface shape is measured using a solid shape measuring device, at the time of calibration.

12. A method according to claim 11, wherein the solid shape measuring device comprises an atomic force microscope.

13. A method according to claim 11, wherein the solid shape measuring device comprises a probe type solid shape measuring device.

14. A method according to claim 10, wherein, when a surface shape of plural marks on the second object is measured outside the exposure apparatus and before and after the resist application, an offset being harmonized with a signal of a detecting system for performing relative alignment of the first and second objects, in the exposure apparatus for transferring the pattern of the first object onto the second object, is used in the exposure apparatus.

15. A method according to claim 14, wherein the surface shape is measured outside the exposure apparatus, on the basis of optical three-dimensional measurement calibrated by a three-dimensional shape measuring system using non-exposure light.

16. A method of relatively aligning a first object and a second object with each other in an exposure apparatus for transferring a pattern of the first object onto the second object, said method comprising:

a first transmitting step for transmitting, to a remote location and through a public data line, a mark detection signal obtained by detecting a mark on the second object by use of a detecting system, for performing relative alignment of the first and second objects in the exposure apparatus, and shape information obtained by measuring a surface shape of the mark on the second object, outside the exposure apparatus and before and after resist application;

a calculating step for calculating an offset of the exposure apparatus, at the remote location; and a second transmitting step for transmitting information, including the offset, to the exposure apparatus through the public data line, wherein alignment of the first and second object is carried out by the detecting system and on the basis of the information including the offset, and an exposure process is carried out in the exposure apparatus, wherein, for alignment of plural second objects, with respect to a first one of the plural second objects, an offset as being harmonized with a signal of a detecting system for performing relative alignment of the first and second objects is measured, and, with respect to the remaining second objects, the same offset is used.

17. A data processing system for calculating at least one of offset information and offset correction information in relation to an exposure apparatus for transferring a pattern of a first object onto a second object, said system comprising:

means for obtaining shape information related to a mark on the second object obtained at a remote location as well as detection information of the mark obtained by the exposure apparatus, through a public data line;

means for calculating the offset produced in the exposure apparatus, on the basis of the shape information and the detection information, obtained by said obtaining means; and means for transmitting at least one of the offset information and the offset correction information to the exposure apparatus at the remote location, through the public data line.

18. An exposure system, comprising:

a plurality of exposure apparatuses each for transferring a pattern of a first object onto a second object; and a data processing system for calculating at least one of offset information and offset correction information in relation to an offset to be produced in each exposure apparatus, said data processing system having (i) means for obtaining shape information related to a mark on the second object obtained at a remote location as well as detection information of the mark obtained by the exposure apparatus, through a public data line, (ii) means for calculating the offset produced in the exposure apparatus, on the basis of the shape information and the detection information, obtained by said obtaining means, and (iii) means for transmitting at least one of the offset information and the offset correction information to the exposure apparatus at the remote location, through the public data line, wherein, on the basis of information supplied by said data processing system, offset correction is carried out for the exposure apparatuses being present at remote locations, and wherein an alignment process for alignment of the first and second objects is carried out in each exposure apparatus, and an exposure process is carried out so that the pattern of the first object is transferred to the second object.

19. A device manufacturing method, comprising the steps of:

building an exposure system which includes a plurality of exposure apparatuses each for transferring a pattern of a first object onto a second object, and a data processing system for calculating at least one of offset information and offset correction information in relation to an offset to be produced in each exposure apparatus, the data processing system having (i) means for obtaining shape information related to a mark on the second object obtained at a remote location as well as detection information of the mark obtained by the exposure apparatus, through a public data line, (ii) means for calculating the offset produced in the exposure apparatus, on the basis of the shape information and the detection information, obtained by the obtaining means, and (iii) means for transmitting at least one of the offset information and the offset correction information to the exposure apparatus at the remote location, through the public data line;

performing, on the basis of information supplied by the data processing system, offset correction for the exposure apparatuses being present at remote locations;

performing an alignment process for alignment of the first and second objects, in each exposure process; and performing an exposure process so that the pattern of the first object is transferred to the second object.

20. A device manufacturing method, comprising:
   a first transmitting step for transmitting, to a remote location and through a public data line, a mark detection signal obtained by detecting a mark on a second object by use of a detecting system, for performing relative alignment of a first object and the second object in the exposure apparatus, and shape information obtained by measuring a surface shape of the mark on the second object, outside the exposure apparatus and before and after resist application;
   a calculating step for calculating an offset of the exposure apparatus, at the remote location; and
   a second transmitting step for transmitting information, including the offset, to the exposure apparatus through the public data line;
   wherein alignment of the first and second object is carried out by the detecting system and on the basis of the information including the offset, and an exposure process is carried out in the exposure apparatus, for production of a device from the second object.

21. A system having an exposure apparatus for transferring a pattern of a first object onto a second object, said system comprising:
   an exposure apparatus having a detecting system for performing relative alignment of the first object and the second object;
   a transmitting system for transmitting, to a remote location and through a public data line, a mark detection signal obtained by detection of a mark of the second object made by use of said detecting system and shape information obtained by measurement of a shape of the mark on the second object; and
   a calculating system for preparing a database of information including apparatus error information, at the remote location, and also for performing calculation of an offset on the basis of simulation,
   wherein said calculating system transmits information, including the offset, to the exposure apparatus and through the public data line, and
   wherein, on the basis of the information including the offset, alignment of the first and second objects is executed by using said detecting system and an exposure process is performed in said exposure apparatus.

22. A system having an exposure apparatus for transferring a pattern of a first object onto a second object, said system comprising:
   a production factory being equipped with (i) a group of production machines for various processes, including an exposure apparatus having a detecting system for performing relative alignment of the first and second objects, (ii) a local area network for connecting the production machines with each other, and (iii) a gateway for enabling access from the local area network to a public data line outside the production factory, such that data communication for information related to at least one of the production machines is enabled, and that a mark detection signal obtained by detecting a mark on the second object by use of the detecting system as well as shape information obtained by measuring the shape of the mark on the second object can be transmitted to a remote location, from the local area network and through the public data line; and
   a calculating system for calculating an offset of the exposure apparatus, at the remote location,
   wherein said calculating system transmits information, including the offset, to the exposure apparatus through the public data line and the local area network, and
   wherein, on the basis of the information including the offset, alignment of the first and second objects is executed by using said detecting system and an exposure process is performed in said exposure apparatus.

23. A system according to claim 22, wherein a user interface for enabling access to a maintenance database provided by a user or a vendor of the exposure apparatus and being connected to the public data line, is presented on a display, such that information can be obtained from the database through an external network.

24. An adjusting method for a plurality of exposure apparatuses each for transferring a pattern of a first object onto a second object, said method comprising:
   a first transmitting step for transmitting, in relation to each of the exposure apparatuses, shape information related to a mark on a second object to be used in that exposure apparatus and detection information obtained by detecting the mark on the second object in that exposure apparatus, limitedly to a vendor only who supplied that exposure apparatus, through a public data line; and
   a second transmitting step for transmitting, from each vendor, at least one of offset information and offset correction information back to a corresponding exposure apparatus, through the public data line.

25. A device manufacturing method for use with a plurality of exposure apparatuses each for transferring a pattern of a first object onto a second object, said method comprising:
   a first transmitting step for transmitting, in relation to each of the exposure apparatuses, shape information related to a mark on a second object to be used in that exposure apparatus and detection information obtained by detecting the mark on the second object in that exposure apparatus, limitedly to a vendor only who supplied that exposure apparatus, through a public data line; and
   a second transmitting step for transmitting, from each vendor, at least one of offset information and offset correction information back to a corresponding exposure apparatus, through the public data line; and
   a transfer step for performing pattern transfer to a second object by use of an exposure apparatus having been adjusted on the basis of the offset information and/or the offset correction information, such that a device can be produced from the second object.

26. A method of supplying adjustment information for an exposure apparatus for transferring a pattern of a first object onto a second object, said method comprising:
   a receiving step for receiving, from a remote location and through a public data line, a mark detection signal obtained by detecting a mark on the second object by use of a detecting system for performing relative alignment of the first and second objects in the exposure apparatus, as well as shape information obtained by measuring the mark of the second object, outside the exposure apparatus and before and after resist application;
   a calculating step for preparing a database on the basis of data received at the remote location and also for calculating an offset of the exposure apparatus by use of the database;
   an offset transmitting step for transmitting information, including the offset, to the exposure apparatus and through the public data line, wherein, on the basis of the information including the offset, relative alignment of the first and second objects is carried out, and an exposure process is carried out in the exposure apparatus; and a bill calculating step for calculating a charge to be applied to a user of the exposure apparatus in regard to the offset transmission.

27. A method according to claim 26, further comprising a counting step for counting the frequency of data receptions through the receiving step, wherein the bill calculation is performed while taking into account the frequency of data receptions.

28. A method of supplying adjustment information for an exposure apparatus for transferring a pattern of a first object onto a second object, said method comprising:

a receiving step for receiving, from a remote location and through a public data line, a mark detection signal obtained by detecting a mark on the second object by use of a detecting system for performing relative alignment of the first and second objects in the exposure apparatus, as well as information related to a surface shape of the mark on the second object;

a calculating step for preparing a database on the basis of data received at the remote location and also for calculating an offset of the exposure apparatus by use of the database;

an offset transmitting step for transmitting information, including the offset, to the exposure apparatus and through the public data line, wherein, on the basis on the information including the offset, relative alignment of the first and second objects is carried out, and an exposure process is carried out in the exposure apparatus; and a bill calculating step for calculating a charge to be applied to a user of the exposure apparatus in regard to the offset transmission.

29. A method according to claim 28, further comprising a storing step for memorizing the frequency of data receptions through the receiving step, wherein the bill calculation is performed while taking into account the frequency of data receptions.

30. A method according to claim 28, wherein the reception of information at said receiving step is carried out with respect to plural remote locations.

31. A computer system for supplying adjustment information to an exposure apparatus for transferring a pattern of a first object onto a second object, said computer system comprising:

connection means for enabling communication with a public data line; and (a) software introduced to carry out a procedure including (i) a receiving step for receiving, from a remote location and through the public data line, a mark detection signal obtained by detecting a mark on the second object by use of a detecting system for performing relative alignment of the first and second objects in the exposure apparatus, as well as information related to a surface shape of the mark on the second object, (ii) a calculating step for preparing a database on the basis of data received at the remote location and also for calculating an offset of the exposure apparatus by use of the database, (iii) an offset transmitting step for transmitting information, including the offset, to the exposure apparatus and through the public data line, wherein, on the basis of the information including the offset, relative alignment of the first and second objects is carried out, and wherein an exposure process is carried out in the exposure apparatus, and (iv) a bill calculating step for calculating a charge to be applied to a user of the exposure apparatus in regard to the offset transmission.

* * * * *

UNITED STATES PATENT AND TRADEMARK OFFICE
CERTIFICATE OF CORRECTION

PATENT NO.   : 6,493,065 B2
DATED        : December 10, 2002
INVENTOR(S)  : Hideki Ina et al.

It is certified that error appears in the above-identified patent and that said Letters Patent is hereby corrected as shown below:

Column 1,
Line 44, "available-" should read -- available. --

Column 3,
Line 29, "water" should read -- wafer --.

Column 5,
Line 35, "in" should read -- is --.

Column 17,
Line 30, "basis on" should read -- basis of --.

Signed and Sealed this

Twenty-sixth Day of August, 2003

JAMES E. ROGAN
*Director of the United States Patent and Trademark Office*